(12) United States Patent
Tsai et al.

(10) Patent No.: US 9,343,151 B1
(45) Date of Patent: May 17, 2016

(54) RESISTIVE RANDOM ACCESS MEMORY AND METHOD OF RESETTING A RESISTIVE RANDOM ACCESS MEMORY

(71) Applicant: Taiwan Semiconductor Manufacturing Company Limited, Hsinchu (TW)

(72) Inventors: Chun-Yang Tsai, Hsinchu (TW); Yu-Wei Ting, Taipei (TW); Kuo-Ching Huang, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 14/593,075

(22) Filed: Jan. 9, 2015

(51) Int. Cl.
G11C 11/00 (2006.01)
G11C 11/36 (2006.01)
G11C 13/00 (2006.01)

(52) U.S. Cl.
CPC ........ *G11C 13/0097* (2013.01); *G11C 13/0038* (2013.01)

(58) Field of Classification Search
USPC .................................. 365/148, 158, 163, 175
See application file for complete search history.

(56) References Cited

U.S. PATENT DOCUMENTS

| 8,094,488 | B2* | 1/2012 | Lee | G11C 13/0004 365/148 |
| 8,143,653 | B2* | 3/2012 | Cho | G11C 11/56 365/148 |
| 8,238,149 | B2* | 8/2012 | Shih | G11C 13/0004 365/148 |
| 8,284,589 | B2* | 10/2012 | Scheuerlein | B82Y 10/00 365/148 |
| 8,289,749 | B2* | 10/2012 | Chen | G11C 13/0007 365/148 |
| 8,406,033 | B2* | 3/2013 | Lung | G11C 13/0004 365/148 |
| 8,619,450 | B2* | 12/2013 | Hamilton | B82Y 10/00 365/148 |
| 8,634,227 | B2* | 1/2014 | Yu | G11C 8/10 365/148 |
| 9,007,822 | B2* | 4/2015 | Hendrickson | G11C 8/10 365/148 |

\* cited by examiner

*Primary Examiner* — Trong Phan
(74) *Attorney, Agent, or Firm* — Jones Day

(57) ABSTRACT

According to another embodiment, a method of a reset operation for a RRAM is provided. The method includes the following operations: providing a first voltage to the dielectric side electrode of the resistor; and providing a second voltage to a gate of the transistor, wherein the first voltage in a second loop is lower than that in a first loop, and the second voltage in the second loop is higher than that in the first loop.

20 Claims, 9 Drawing Sheets

| Operation | | Reset | |
|---|---|---|---|
| | | First Loop | Second Loop |
| WL | Select | $V_{WL1}$ (2.5V) | $V_{WL2}$ (2.6V) |
| | Unselected | Ground | Ground |
| BL | Select | Ground | Ground |
| | Unselected | Ground | Ground |
| SL | Select | $V_{SL1}$ (1.8V) | $V_{SL2}$ (1.7V) |
| | Unselected | Ground | Ground |

Fig. 2

| Operation | | Reset | |
|---|---|---|---|
| | | First Loop | Second Loop |
| WL | Select | $V_{WL1}$ (2.5V) | $V_{WL2}$ (2.6V) |
| | Unselected | Ground | Ground |
| SL | Select | Ground | Ground |
| | Unselected | Ground | Ground |
| BL | Select | $V_{BL1}$ (1.8V) | $V_{BL2}$ (1.7V) |
| | Unselected | Ground | Ground |

Fig. 5

RESISTIVE RANDOM ACCESS MEMORY AND METHOD OF RESETTING A RESISTIVE RANDOM ACCESS MEMORY

BACKGROUND

Resistive random access memory (RRAM) is one possible candidate for next generation nonvolatile memory technology due to its simple and CMOS logic compatible process. The RRAM cell includes a metal oxide material sandwiched between top and bottom electrodes. By applying voltage to the RRAM cell, a switching event from high resistance state (HRS) to low resistance state (LRS) occurs and is called the "set" operation. Conversely, the switching event from LRS to HRS is called the "reset" operation. The low and high resistances are utilized to indicate a digital signal, "1" or "0", thereby allowing for data storage.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2 is an exemplary table of the reset operations of the RRAM 100 in FIG. 1 in accordance with some embodiments.

FIG. 5 is an exemplary table of the reset operations of the RRAM 400 in FIG. 4 in accordance with some embodiments.

BRIEF SUMMARY OF THE INVENTION

Figure 1:
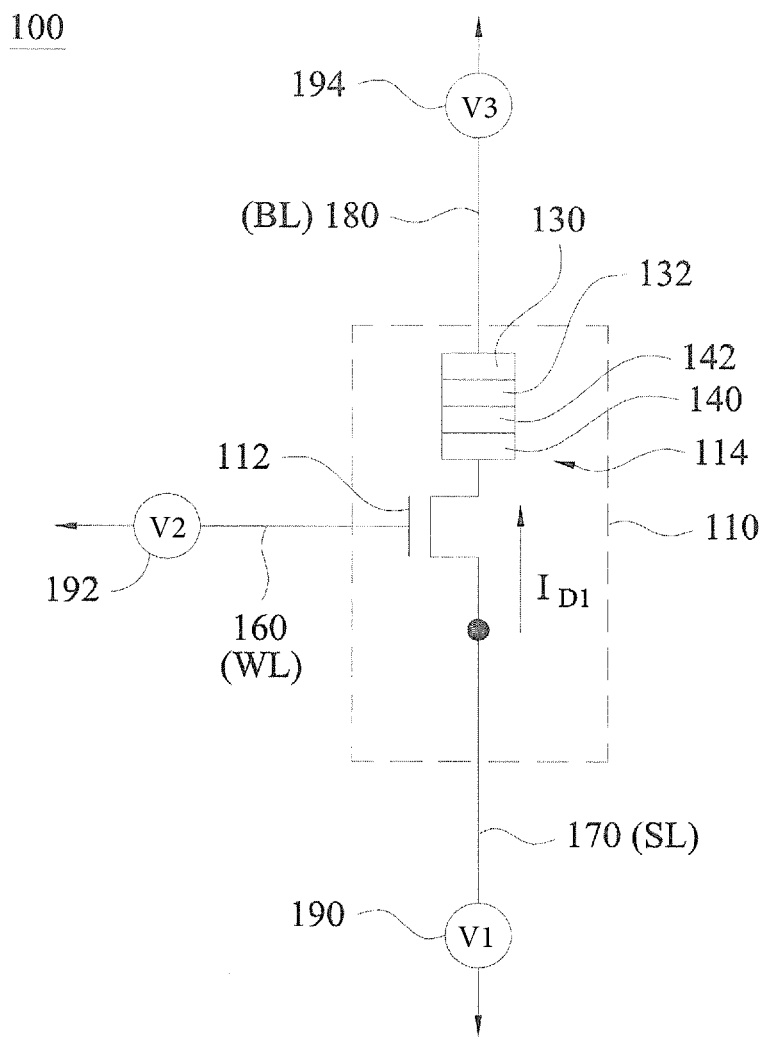
FIG. 1 is a block diagram of an exemplary resistive random access memory in accordance with some embodiments.

One embodiment of the invention provides a resistive random access memory (RRAM). The RRAM comprises a resistor, a transistor, a first voltage source, and a second voltage source. The resistor comprises a cap side electrode and a dielectric side electrode. A drain of the transistor is electrically connected to the dielectric side electrode. The first voltage source is electrically connected to a source of the transistor. The second voltage source is electrically connected to a gate of the transistor. For a reset operation comprising at least two loops, the first voltage source provides a lower voltage in a second loop than the first voltage source does in a first loop, and the second voltage source provides a higher voltage in the second loop than the second voltage source does in the first loop.

One embodiment of the invention provides a resistive random access memory (RRAM). The RRAM comprises a resistor, a transistor, a first voltage source, and a second voltage source. The resistor comprises a cap side electrode and a dielectric side electrode. A drain of the transistor is electrically connected to the cap side electrode of the resistor. The first voltage source is electrically connected to the dielectric side electrode of the resistor. The second voltage source is electrically connected to a gate of the transistor. For a reset operation comprising at least two loops, the first voltage source provides a lower voltage in a second loop than the first voltage source does in a first loop, and the second voltage source provides a higher voltage in the second loop than the second voltage source does in the first loop.

One embodiment of the invention provides a method of reset operation for resistive random access memory (RRAM). The RRAM comprises a resistor and a transistor. The resistor comprises a cap side electrode and a dielectric side electrode, and a drain of the transistor is electrically connected to the dielectric side electrode of the resistor. The method comprises: providing a first voltage to a source of the transistor; and providing a second voltage to a gate of the transistor, wherein the first voltage in a second loop is lower than that in a first loop, and the second voltage in the second loop is higher than that in the first loop.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In order to enhance reliability of the reset operation of an RRAM, a composite reset scheme is applied to the RRAM. The composite reset scheme may include several reset loops (e.g., two loops). When the first reset loop does not succeed in switching from LRS to HRS, a second reset loop with a higher WL voltage and a lower SL voltage than the first reset loop will be utilized. As a result, in the second loop, higher word line voltage increases the current which flows through the variable resistor, and lower source line voltage decreases the stress on the variable resistor. As such, the reset scheme can speed up the reset operation without damaging the RRAM.

The loop in the disclosure refers to an operation loop. For example, the reset loop refers to an operation loop for reset operation.

In some embodiments, the transistor comprises at least one of a MOSFET, a BJT, or an HEMT ("High-Electron-Mobility Transistor"). The reset operation may be applied to a conductive-bridging RAM (CBRAM) or a magneto-resistive RAM (MRAM) which have the same characteristics as RRAM.

FIG. 1 is a block diagram of an exemplary resistive random access memory in accordance with some embodiments. As shown in FIG. 1, an RRAM (resistive random access memory) 100 is provided. The RRAM 100 may include a first RRAM cell 110, a first voltage source 190 (denoted "V1" in FIG. 1), a second voltage source 192 (denoted "V2" in FIG. 1), and a third voltage source 194 (denoted "V3" in FIG. 1). The first RRAM cell 110 includes a first transistor 112 and a first variable resistor 114.

The first variable resistor 114 includes a cap side electrode 130, a dielectric side electrode 140, a cap layer 132, and a dielectric layer 142. The cap layer 132 is in electrical contact with the cap side electrode 130; the dielectric layer 142 is in electrical contact with the dielectric side electrode 140. The cap side electrode 130 and the dielectric side electrode 140 may be made of metal, metal nitride, or doped-poly, for example, Al, Ti, Ta, Au, Pt, W, Ni, Ir, TiN, TaN, n-doped poly, p-doped poly. The cap layer 132 may be made of metal or metal-oxide, for example, Al, Ti, Ta, Hf, TiOx, HfOx, ZrOx, GeOx, CeOx. In some embodiments, the first variable resistor 114 does not include the cap layer 132.

In the embodiment, the gate of the first transistor 112 of the first RRAM cell 110 is electrically connected to a first word line 160. The drain of the first transistor 112 of the first RRAM cell 110 is electrically connected to the dielectric side electrode 140 of the first variable resistor 114. The source of the first transistor 112 of the first RRAM cell 110 is electrically connected to a first source line 170. The cap side electrode 130 of the first variable resistor 114 is electrically connected to a first bit line 180 (BL). The second voltage source 192 is electrically connected to the first word line 160 (WL). The first voltage source 190 is electrically connected to the first source line 170 (SL). The third voltage source 194 is electrically connected to the first bit line 180 (BL).

FIG. 2 is an exemplary table of the reset operations of the RRAM 100 in FIG. 1 in accordance with some embodiments. The term "Selected" refers to those word lines, bit lines, and source lines that are connected to the RRAM cell to be reset. The term "Unselected" refers to those word lines, bit lines, and source lines that are not connected to the RRAM to be reset.

In order to ensure the reset operation of the RRAM, a composite reset scheme is applied to the RRAM. The composite reset scheme may include several reset loops (e.g., two loops). When the first reset loop does not succeed in a switching from LRS to HRS, the second reset loop with a higher WL voltage and a lower SL voltage than the first reset loop will be utilized.

For example, a voltage of about 2.5V is applied during the reset operation in the first loop to the selected word line (WL). A voltage of about 1.8V is applied during the reset operation in the first loop to the selected source line (SL). A voltage of about 2.6V is applied during the reset operation in the second loop to the selected word line (WL). A voltage of about 1.7V is applied during the reset operation in the second loop to the selected source line (SL). A ground voltage is applied during the reset operation in both the first loop and the second loop to the selected bit line (BL). A ground voltage is applied during the reset operation in both of the first loop and the second loop to the unselected word lines, the unselected bit lines, and the unselected source lines.

By using the abovementioned configuration, for the reset operation including the two loops, the first voltage source 190 provides a lower voltage $V_{SL2}$ (the last part of the subscripts to follow refer to the loop, i.e. $V_{SL2}$ is the voltage applied to the source line during the second loop) (e.g., about 1.7V) at the source line during the second loop than it is applied to $V_{SL1}$ (e.g., about 1.8V) during the first loop; also, the second voltage source provides a higher voltage $V_{WL2}$ (e.g., about 2.6V) at the word line in the second loop than it is applied to $V_{wL1}$ (e.g., about 2.5V) in the first loop. As a result, in the second loop, higher word line voltage $V_{WL2}$ increases the current $I_D$ which flows through the first variable resistor 114, and lower source line voltage $V_{SL2}$ decrease the stress on the first variable resistor 114. As such, the abovementioned reset scheme can speed up reset operation without damaging the RRAM 100.

Figure 3:
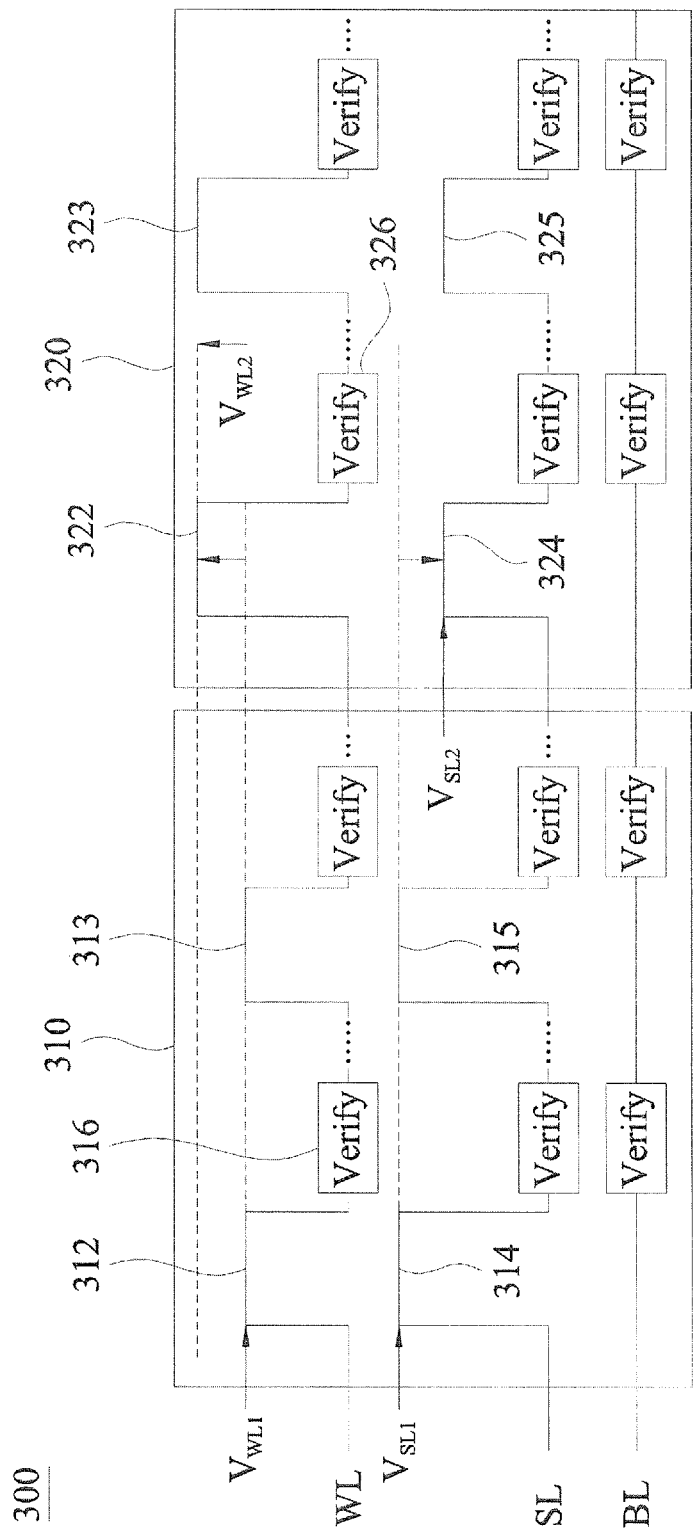
FIG. 3 is an exemplary waveform of the word line, bit line, and source line of the RRAM in FIG. 1 during consecutive reset loops in accordance with some embodiments.

FIG. 3 is an exemplary waveform of the word line, bit line, and source lines of the RRAM in FIG. 1 during consecutive reset loops in accordance with some embodiments. As shown in FIG. 3 and referring to the configuration of FIG. 1, a set of waveforms of a reset operation 300 is provided. The reset operation 300 includes the first loop 310 and the second loop 320.

In the first loop 310 for the reset operation 300, the word line WL provides pulses 312, 313 with an amplitude of $V_{wL1}$ (e.g., about 2.5V) and the source line SL provides pulses 314, 315 with an amplitude of $V_{SL1}$ (e.g., about 1.8V). After each of the pulses (e.g., 312 and 314) for the reset operation, a verification period 316 follows. In the second loop 320 for the reset operation 300, the word line WL provides pulses 322, 323 with an amplitude of $V_{wL1}$ (e.g., about 2.6V) and the source line SL provides pulses 324, 325 with an amplitude of $V_{SL1}$ (e.g., about 1.7V). After each of the pulses (e.g., 322 and 324) for the reset operation, a verification period 326 follows. As a result, in the second loop 320 higher word line voltage $V_{WL2}$ increases the current $I_{D2}$ which flows through the transistor 112, and lower source line voltage $V_{SL2}$ decreases the stress on the first variable resistor 114. As such, the abovementioned reset scheme can speed up the reset operation without damaging the RRAM 100.

Figure 4:
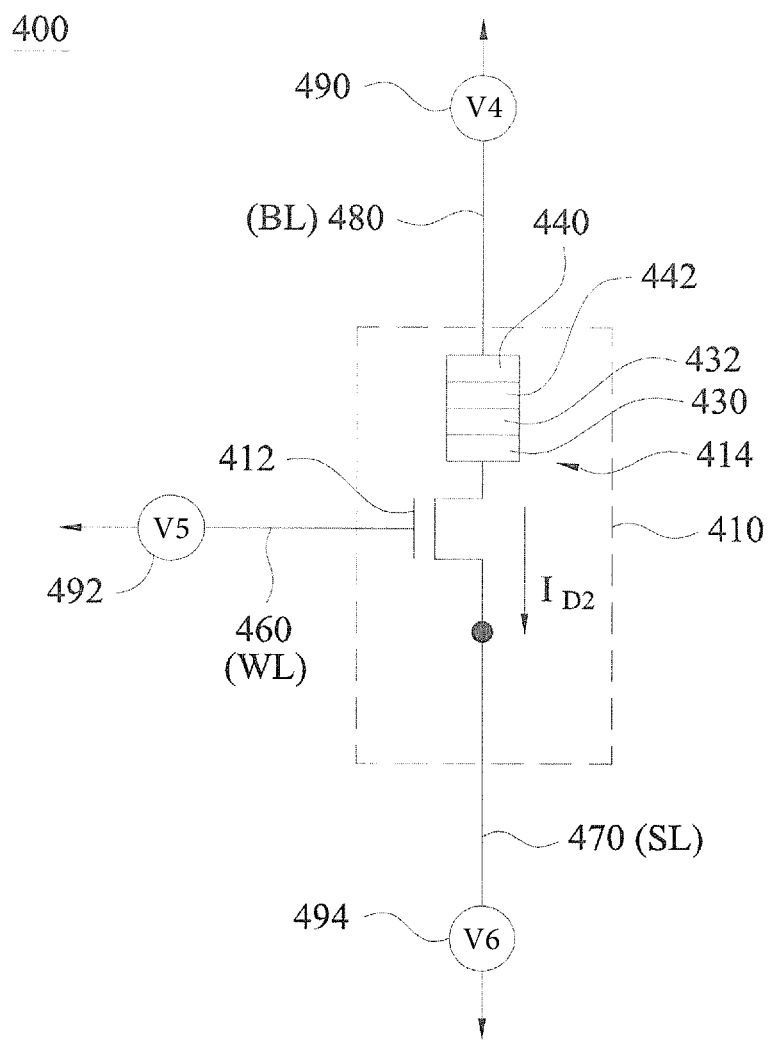
FIG. 4 is a block diagram of an exemplary resistive random access memory in accordance with some embodiments.

FIG. 4 is a block diagram of an exemplary resistive random access memory in accordance with some embodiments. As shown in FIG. 4, an RRAM (resistive random access memory) 400 is provided. The RRAM 400 may include a first RRAM cell 410, a first voltage source 490 (denoted "V4" in FIG. 4), a second voltage source 492 (denoted "V5" in FIG. 4), and a third voltage source 494 (denoted "V6" in FIG. 4). The first RRAM cell 410 includes a first transistor 412 and a first variable resistor 414. Compared to the RRAM 100 in FIG. 1, the RRAM 400 has a resistor 414 with reversed polarity.

The first variable resistor 414 includes a cap side electrode 430, a dielectric side electrode 440, a cap layer 432, and a dielectric layer 442. The cap layer 432 is in electrical contact with the cap side electrode 430; the dielectric layer 442 is in electrical contact with the dielectric side electrode 440. The cap side electrode 430 and the dielectric side electrode 440 may be made of metal, metal nitride, or doped-poly, for example, Al, Ti, Ta, Au, Pt, W, Ni, Ir, TiN, TaN, n-doped poly, p-doped poly. The cap layer 432 may be made of metal or metal-oxide, for example, Al, Ti, Ta, Hf, TiOx, HfOx, ZrOx, GeOx, CeOx. In some embodiments, the first variable resistor 414 does not include the cap layer 432.

In the embodiment, the gate of the first transistor 412 of the first RRAM cell 410 is electrically connected to a first word line 460. The drain of the first transistor 412 of the first RRAM cell 410 is electrically connected to the cap side electrode 430 of the first variable resistor 414. The source of the first transistor 412 of the first RRAM cell 410 is electrically connected to a first source line 470. The dielectric side electrode 440 of the first variable resistor 414 is electrically connected to a first bit line 480 (BL). The second voltage source 492 is electrically connected to the first word line 460 (WL). The first voltage source 490 is electrically connected to the first bit line 480 (BL). The third voltage source 494 is electrically connected to the first source line 470 (SL).

FIG. 5 is an exemplary table of the reset operations of the RRAM 400 in FIG. 4 in accordance with some embodiments. The term "Selected" refers to those word lines, bit lines, and source lines that are connected to the RRAM cell to be reset. The term "Unselected" refers to those word lines, bit lines, and source lines that are not connected to the RRAM to be reset.

In order to enhance reliability of the reset operation of the RRAM, a composite reset scheme is applied to the RRAM. The composite reset scheme may include several reset loops (e.g., two loops). When a first reset loop does not succeed in switching from LRS to HRS, a second reset loop with a higher WL voltage and a lower BL voltage than the first reset loop will be utilized.

For example, a voltage of about 2.5V is applied during the reset operation in the first loop to the selected word line (WL). A voltage of about 1.8V is applied during the reset operation in the first loop to the selected bit line (BL). A voltage of about 2.6V is applied during the reset operation in the second loop to the selected word line (WL). A voltage of about 1.7V is applied during the reset operation in the second loop to the selected bit line (BL). The ground voltage is applied during the reset operation in both of the first loop and the second loop to the selected source line (SL). The ground voltage is applied during the reset operation in both of the first loop and the second loop to the unselected word lines, the unselected bit lines, and the unselected source lines.

By using the abovementioned configuration, for the reset operation including the two loops, the first voltage source 490 provides a lower voltage $V_{BL2}$ (the last part of the subscripts to follow refer to the loop, i.e. $V_{BL2}$ is the voltage applied to the source line during the second loop) (e.g., about 1.7V) at the bit line in the second loop than it does $V_{BL1}$ (e.g., about 1.8V) in the first loop, and the second voltage source provides a higher voltage $V_{WL2}$ (e.g., about 2.6V) at the word line in the second loop than it is applied to $V_{wL1}$ (e.g., about 2.5V) in the first loop. As a result, in the second loop, higher word line voltage $V_{WL2}$ increases the current $I_{D1}$ which flows through first variable resistor 414, and lower bit line voltage $V_{BL2}$ decrease the stress on the first variable resistor 414. As such, the abovementioned reset scheme can speed up reset operation without damaging the RRAM 400.

Figure 6:
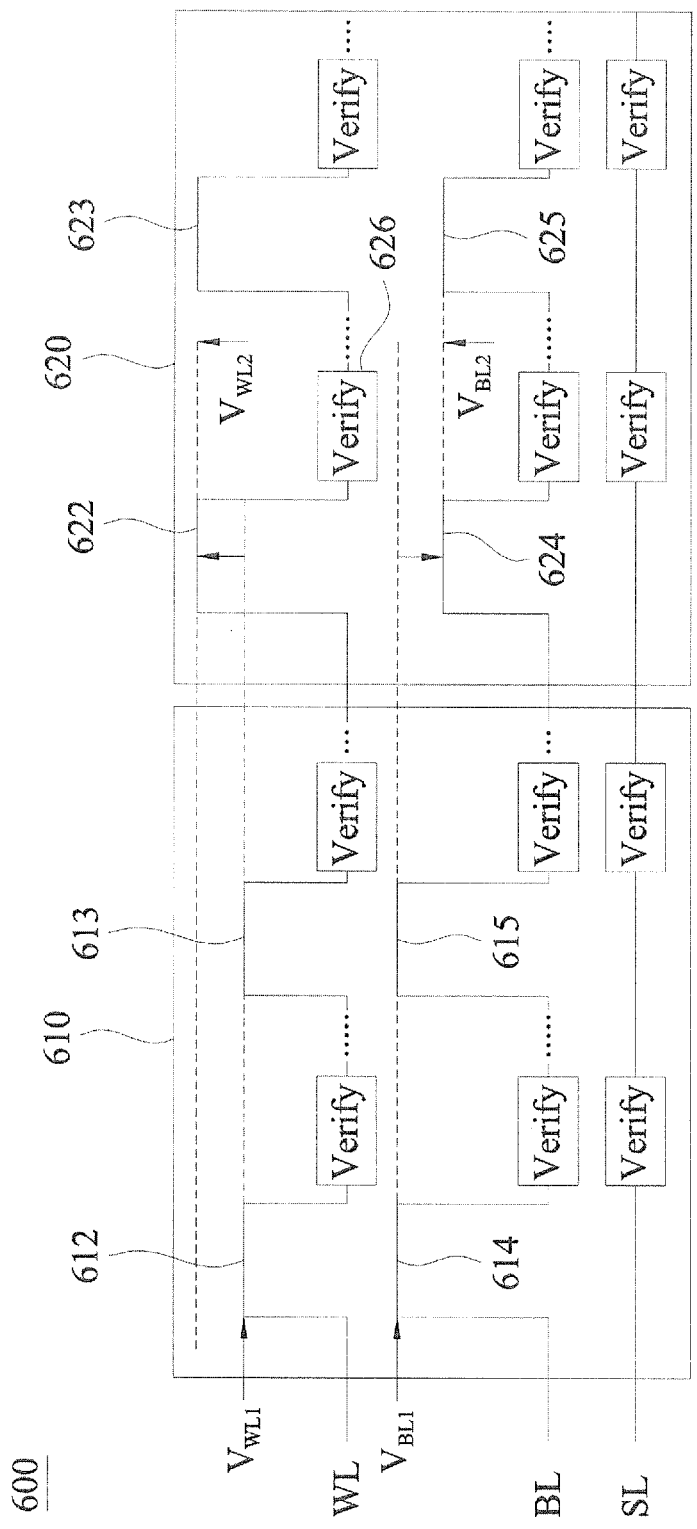
FIG. 6 is an exemplary waveform of the word line, bit line, and source line of the RRAM in FIG. 4 during consecutive reset loops in accordance with some embodiments.

FIG. 6 is an exemplary waveform of the word line, bit line, and source line of the RRAM in FIG. 4 during consecutive reset loops in accordance with some embodiments. As shown in FIG. 6 and referring to the configuration of FIG. 4, a set of waveforms of a reset operation 600 is provided. The reset operation 600 includes the first loop 610 and the second loop 620.

In the first loop 610 for the reset operation 600, the word line WL provides pulses 612, 613 with an amplitude of $V_{wL1}$ (e.g., about 2.5V) and the bit line BL provides pulses 614, 615 with an amplitude of $V_{BL1}$ (e.g., about 1.8V). After each of the pulses (e.g., 612 and 614) for the reset operation, a verification period 616 follows. In the second loop 620 for the reset operation 600, the word line WL provides pulses 622, 623 with an amplitude of $V_{wL1}$ (e.g., about 2.6V) and the bit line BL provides pulses 624, 625 with an amplitude of $V_{BL1}$ (e.g., about 1.7V). After each of the pulses (e.g., 622 and 624) for the reset operation, a verification period 626 follows. As a result, in the second loop 620, higher word line voltage $V_{WL2}$ increases the current $I_D$ which flows through the first variable resistor 414, and lower bit line voltage $V_{BL2}$ decreases the stress on the first variable resistor 414. As such, the abovementioned reset scheme can speed up reset operation without damaging the RRAM 400.

Figure 7:
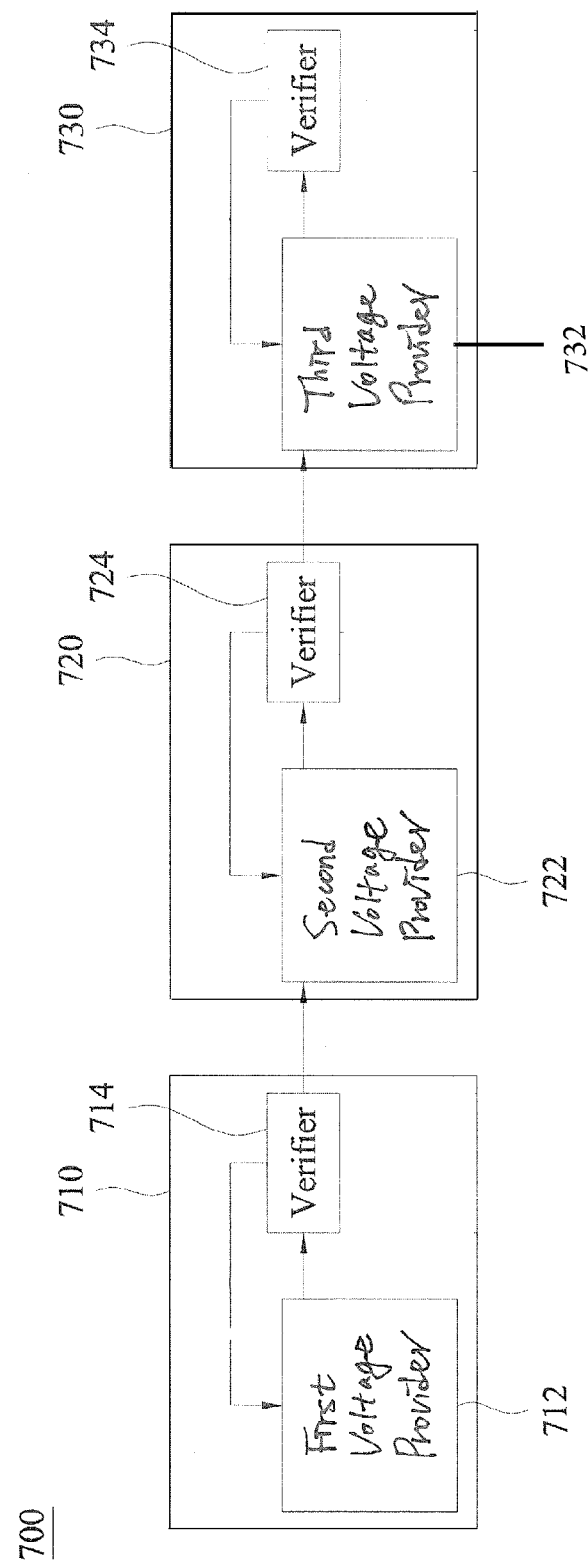
FIG. 7 is an exemplary block diagram of a reset configuration for the reset scheme 600 in FIG. 6 during consecutive reset loops in accordance with some embodiments.

FIG. 7 is an exemplary block diagram of a reset configuration for the reset scheme 600 in FIG. 6 during consecutive reset loops in accordance with some embodiments. As shown in FIG. 7, a reset configuration 700 is provided. The reset configuration 700 includes loops 710, 720, and 730. In some embodiments, the reset configuration 700 may include more loops. The loop in the disclosure refers to an operation loop. For example, the reset loop refers to an operation loop for reset operation.

As shown in FIGS. 4, 6 and 7, for example, the reset algorithm 700 starts from the first loop 710. The first loop 710 utilizes a first voltage provider 712 and a first verifier 714. The first voltage provider 712 provides the pulses 612, 613 with the amplitude of $V_{wL1}$ (e.g., about 2.5V) and the pulses 614, 615 with the amplitude of $V_{BL1}$ (e.g., about 1.8V) to the RRAM 400 to be reset. The first verifier 714 is electrically connected to the first variable resistor 414 and verifies whether the first variable resistor 414 is reset. If the first variable resistor 414 is not reset, the first verifier 714 requests the first voltage provider 712 to repeat. When the verification conducted by the first verifier 714 occurs more than i times (i>0, for example, i=4), the second loop 720 starts.

The second loop 720 utilizes a second voltage provider 722 and a second verifier 724. The second voltage provider 722 provides the pulses 622, 623 with the amplitude of $V_{WL2}$ (e.g., about 2.6V) and the pulses 624, 625 with the amplitude of $V_{BL2}$ (e.g., about 1.7V) to the RRAM 400 to be reset. The second verifier 724 is connected to the first variable resistor 414 and verifies whether the first variable resistor 414 is reset. If the first variable resistor 414 is not reset, the second verifier 724 requests the second voltage provider 722 to repeat. When the verification conducted by the second verifier 724 occurs more than j times (j>0, for example, j=6), the third loop 730 starts. The third loop 730 utilizes a third voltage provider 732 and works similar to the first loop 710 and the second loop 720, providing higher word line voltage and lower bit line voltage. When the verification conducted by a third verifier 734 occurs more than k times (k>=0, for example, k=10), a fourth loop (not shown) starts.

Figure 8:
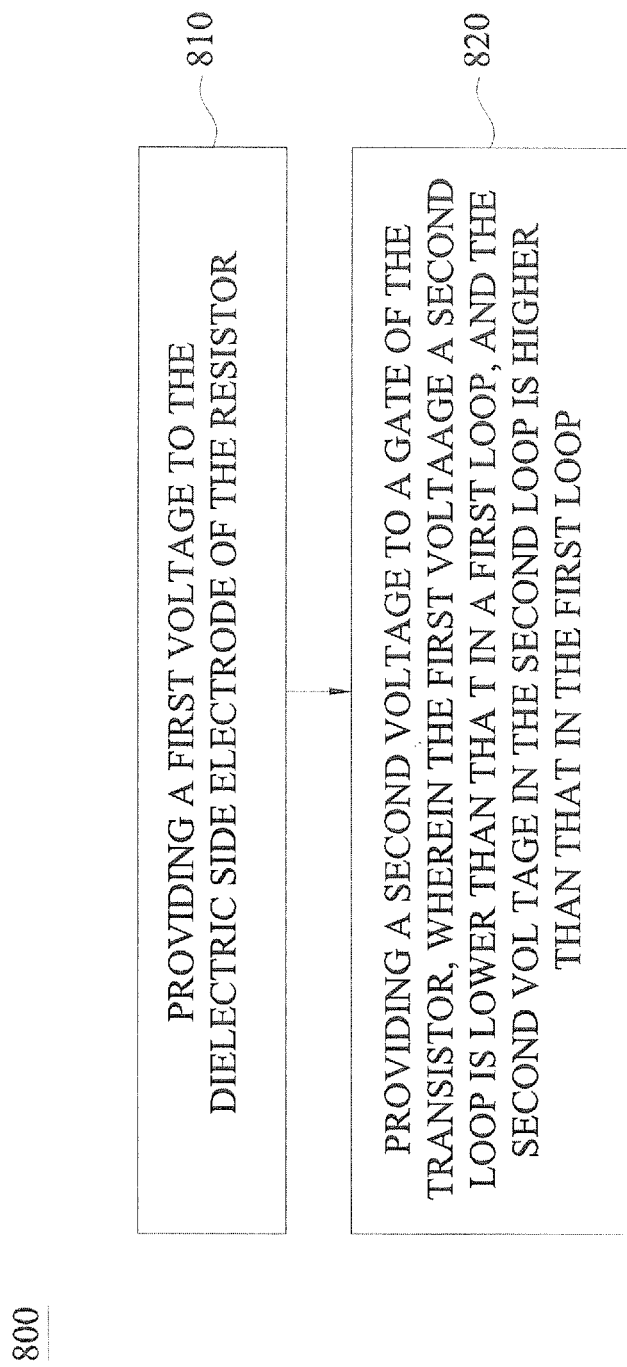
FIG. 8 is a flow chart of a method of a reset operation for a RRAM in accordance with some embodiments.

FIG. 8 is a flow chart of a method of a reset operation for a RRAM in accordance with some embodiments. The RRAM comprises a resistor and a transistor, wherein the resistor comprises a cap side electrode and a dielectric side electrode, and a drain of the transistor is connected to the cap side electrode of the resistor. As shown in FIG. 8, the method 800 includes: providing a first voltage to the dielectric side electrode of the resistor (810); and providing a second voltage to a gate of the transistor, wherein the first voltage in a second loop is lower than that in a first loop, and the second voltage in the second loop is higher than that in the first loop (820).

In some embodiments, the method 800 further comprises providing a ground voltage to a source of the transistor. In some embodiments, wherein providing the first voltage to the dielectric side electrode of the resistor and providing the second voltage to the gate of the transistor further comprises providing the first voltage of about 1.8V and the second voltage source of about 2.5V in the first loop. In some embodiments, wherein providing the first voltage to the dielectric side electrode of the resistor and providing the second voltage to the gate of the transistor further comprises providing the first voltage of about 1.7V and the second voltage of about 2.6V in the second loop.

Figure 9:
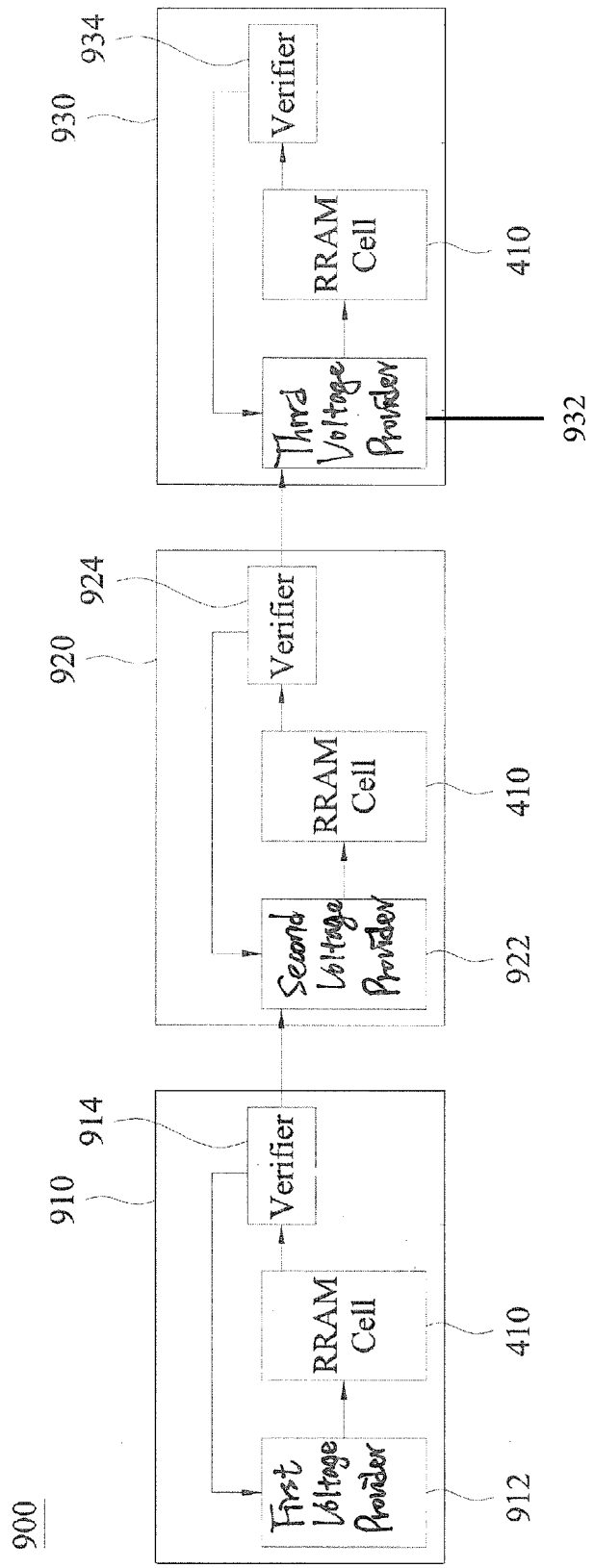
FIG. 9 is another exemplary block diagram of a reset configuration for the reset scheme 600 in FIG. 6 during consecutive reset loops in accordance with some embodiments.

FIG. 9 is an exemplary block diagram of a reset configuration for the reset scheme 600 in FIG. 6 during consecutive reset loops in accordance with some embodiments. As shown in FIG. 9, compared to FIG. 7, another reset configuration 900 with more details is provided. The reset configuration 900 includes loops 910, 920, and 930. In some embodiments, the reset configuration 900 may include more loops. The loop in the disclosure refers to an operation loop. For example, the reset loop refers to an operation loop for reset operation.

As shown in FIGS. 4, 6 and 9, for example, the reset algorithm 900 starts from the first loop 910. The first loop 910 utilizes a first voltage provider 912 for providing stimulus to the RRAM cell 410 and a first verifier 914 for verifying outputs from the RRAM cell 410. For example, the first voltage provider 912 provides the pulses 612, 613 with the amplitude of $V_{WL1}$ (e.g., about 2.5V) and the pulses 614, 615 with the amplitude of $V_{BL1}$ (e.g., about 1.8V) to the RRAM cell 410 to be reset. The first verifier 914 is electrically connected to the first variable resistor 414 and verifies whether the first variable resistor 414 is reset. If the first variable resistor 414 is not reset, the first verifier 914 requests the first voltage provider 912 to repeat. When the verification conducted by the first verifier 914 occurs more than i times (i>0, for example, i=4), the second loop 920 starts.

The second loop 920 utilizes a second voltage provider 922 for providing stimulus to the RRAM cell 410 and a second verifier 924 for verifying outputs from the RRAM cell 410. The second voltage provider 922 provides the pulses 622, 623 with the amplitude of $V_{WL2}$ (e.g., about 2.6V) and the pulses 624, 625 with the amplitude of $V_{BL2}$ (e.g., about 1.7V) to the RRAM cell 410 to be reset. The second verifier 924 is connected to the first variable resistor 414 and verifies whether the first variable resistor 414 is reset. If the first variable resistor 414 is not reset, the second verifier 924 requests the second voltage provider 922 to repeat. When the verification conducted by the second verifier 924 occurs more than j times (j>0, for example, j=6), the third loop 930 starts. The third loop 930 works similar to the first loop 910 and the second loop 920, providing higher word line voltage and lower bit line voltage. When the verification conducted by a third verifier 934 occurs more than k times (k>=0, for example, k=10), a fourth loop (not shown) starts.

In some embodiments, the first voltage provider 912, the second voltage provider 922, and the third voltage provider 932 may be realized by a single voltage provider with different configurations; the first verifier 914, the second verifier 924, and the third verifier 934 may be realized by a single verifier with different configurations.

According to an embodiment, a resistive random access memory (RRAM) is provided. The RRAM includes: a resistor comprising a cap side electrode and a dielectric side electrode; a transistor, a drain of the transistor connected to the dielectric side electrode; a first voltage source connected to a source of the transistor; and a second voltage source connected to a gate of the transistor, wherein for reset operation comprising at least two loops, the first voltage source provides a lower voltage in a second loop than it does in a first loop, and the second voltage source provides a higher voltage in the second loop than it does in the first loop.

According to an embodiment, a resistive random access memory (RRAM) is provided. The RRAM includes: a resistor comprising a cap side electrode and a dielectric side electrode; a transistor, a drain of the transistor connected to the cap side electrode of the resistor; a first voltage source connected to the dielectric side electrode of the resistor; and a second voltage source connected to a gate of the transistor, wherein for reset operation comprising at least two loops, the first voltage source provides a lower voltage in a second loop than it does in a first loop, and the second voltage source provides a higher voltage in the second loop than it does in the first loop.

According to another embodiment, a method of a reset operation for a RRAM is provided. The method includes the following operations: providing a first voltage to the dielectric side electrode of the resistor; and providing a second voltage to a gate of the transistor, wherein the first voltage in a second loop is lower than that in a first loop, and the second voltage in the second loop is higher than that in the first loop.

According to another embodiment, a method of a reset operation for a RRAM is provided. The method includes the following operations: providing a first voltage to a source of the transistor; and providing a second voltage to a gate of the transistor, wherein the first voltage in a second loop is lower than that in a first loop, and the second voltage in the second loop is higher than that in the first loop.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A resistive random access memory (RRAM), comprising:
    a resistor comprising a cap side electrode and a dielectric side electrode;
    a transistor, a drain of the transistor electrically connected to the dielectric side electrode;
    a first voltage source electrically connected to a source of the transistor; and
    a second voltage source electrically connected to a gate of the transistor, wherein for a reset operation comprising at least two loops, the first voltage source provides a lower voltage in a second loop than the first voltage source does in a first loop, and the second voltage source provides a higher voltage in the second loop than the second voltage source does in the first loop.

2. The RRAM of claim 1, further comprising a third voltage source electrically connected to the cap side electrode.

3. The RRAM of claim 1, wherein the third voltage source provides a ground voltage.

4. The RRAM of claim 1, wherein, in the first loop, the first voltage source provides about 1.8V and the second voltage source provides about 2.5V.

5. The RRAM of claim 1, wherein, in the second loop, the first voltage source provides about 1.7V and the second voltage source provides about 2.6V.

6. The RRAM of claim 1, wherein the first voltage source provides a lower voltage in a third loop than the first voltage source does in the second loop, and the second voltage source provides a higher voltage in the third loop than the second voltage source does in the second loop.

7. The RRAM of claim 1, further comprising a verifier electrically connected to the resistor and verifying whether the resistor is reset, wherein if not, the verifier starts another loop.

8. The RRAM of claim 1, wherein the transistor comprises a transistor selected from the group consisting of a MOSFET, a BJT, and an HEMT.

9. A resistive random access memory (RRAM), comprising:
   a resistor comprising a cap side electrode and a dielectric side electrode;
   a transistor, a drain of the transistor electrically connected to the cap side electrode of the resistor;
   a first voltage source electrically connected to the dielectric side electrode of the resistor; and
   a second voltage source electrically connected to a gate of the transistor, wherein for a reset operation comprising at least two loops, the first voltage source provides a lower voltage in a second loop than the first voltage source does in a first loop, and the second voltage source provides a higher voltage in the second loop than the second voltage source does in the first loop.

10. The RRAM of claim 9, further comprising a third voltage source electrically connected to a source of the transistor.

11. The RRAM of claim 9, wherein the third voltage source provides a ground voltage.

12. The RRAM of claim 9, wherein, in the first loop, the first voltage source provides about 1.8V and the second voltage source provides about 2.5V.

13. The RRAM of claim 9, wherein, in the second loop, the first voltage source provides about 1.7V and the second voltage source provides about 2.6V.

14. The RRAM of claim 9, wherein the first voltage source provides a lower voltage in a third loop than the first voltage source does in the second loop, and the second voltage source provides a higher voltage in the third loop than the second voltage source does in the second loop.

15. The RRAM of claim 9, further comprising a verifier electrically connected to the resistor and verifying whether the resistor is reset, wherein if not, the verifier starts another loop.

16. The RRAM of claim 9, wherein the transistor comprises a transistor selected from the group consisting of a MOSFET, a BJT, and an HEMT.

17. A method of reset operation for resistive random access memory (RRAM), the RRAM comprising a resistor and a transistor, wherein the resistor comprises a cap side electrode and a dielectric side electrode, and a drain of the transistor is electrically connected to the dielectric side electrode of the resistor, the method comprising:
   providing a first voltage to a source of the transistor; and
   providing a second voltage to a gate of the transistor, wherein the first voltage in a second loop is lower than that in a first loop, and the second voltage in the second loop is higher than that in the first loop.

18. The method of claim 17, further comprising providing a ground voltage to the cap side electrode.

19. The method of claim 17, wherein providing the first voltage to the source of the transistor and providing the second voltage to the gate of the transistor further comprises providing the first voltage of about 1.8V and the second voltage of about 2.5V in the first loop.

20. The method of claim 17, wherein providing the first voltage to the source of the transistor and providing the second voltage to the gate of the transistor further comprises providing the first voltage of about 1.7V and the second voltage of about 2.6V in the second loop.

* * * * *